(12) United States Patent
Cheng

(10) Patent No.: US 7,585,419 B2
(45) Date of Patent: *Sep. 8, 2009

(54) SUBSTRATE STRUCTURE AND THE FABRICATION METHOD THEREOF

(75) Inventor: Joseph Cheng, Tao Yuan (TW)

(73) Assignee: Boardtek Electronics Corp., Tao Yuan (TW)

( * ) Notice: Subject to any disclaimer, the term of this patent is extended or adjusted under 35 U.S.C. 154(b) by 689 days.

This patent is subject to a terminal disclaimer.

(21) Appl. No.: 11/154,695

(22) Filed: Jun. 17, 2005

(65) Prior Publication Data

US 2006/0286485 A1    Dec. 21, 2006

(51) Int. Cl.
*H01B 13/00* (2006.01)
*B44C 1/22* (2006.01)

(52) U.S. Cl. .............................. 216/13; 216/17; 216/19; 216/41; 29/846; 29/852

(58) Field of Classification Search .................. 29/846, 29/852

See application file for complete search history.

(56) References Cited

U.S. PATENT DOCUMENTS

| | | | | |
|---|---|---|---|---|
| 5,837,154 | A * | 11/1998 | Okabe et al. | 216/14 |
| 6,555,016 | B2* | 4/2003 | Lai | 216/18 |
| 7,347,950 | B2* | 3/2008 | Myung et al. | 216/13 |
| 2004/0018659 | A1* | 1/2004 | Hosokawa et al. | 438/106 |
| 2006/0016553 | A1* | 1/2006 | Watanabe | 156/272.2 |
| 2006/0284292 | A1* | 12/2006 | Cheng | 257/678 |

* cited by examiner

*Primary Examiner*—Shamim Ahmed
(74) *Attorney, Agent, or Firm*—Rosenberg, Klein & Lee

(57) ABSTRACT

A substrate structure and the fabrication method thereof are provided herein. The present invention utilizes a laminate as the support of the package process and then removes the laminate after the following package steps so as to obtain a quite smooth surface for using in the internal-plane structure of the circuit board and a stacking structure that can be applied to many different types of the chip package structures.

31 Claims, 23 Drawing Sheets

SUBSTRATE STRUCTURE AND THE FABRICATION METHOD THEREOF

BACKGROUND OF THE INVENTION

1. Field of the Invention

The present invention generally relates to a substrate structure and the fabrication method thereof, and more particularly relates to a substrate structure having a smooth surface and applying to many kinds of the chip package types and the fabrication method thereof.

2. Description of the Prior Art

Printed Circuit Board (PCB) is the substrate for carrying electronic components and is the basic product of combining the electronics, the mechanism, and the chemical engineering material technology. Such common consuming products, IT products, communication products, medical products, and even navigation and aerospace technology products, all needs to use the PCB substrate serves as a main body for mechanical supporting and electrical connecting. The PCB is a necessary part for all electronics products.

PCB can divide into the hard board and the flexible board according to the softness of the material and divide into the single-sided board, the double-sided board, and the multi-layer board according to the shape. Also, PCB can divide into the paper laminate, the copper claded laminate (CCL), the composite laminate, the woven glass preprag copper claded laminate, flexible or hard CCL, the ceramic laminate, the metal laminate, the thermoplastic laminate, and etc.

However, because elements are respectively bonded on the PCB in the general manufacturing process of the PCB, the whole surface of the PCB is not smooth as the manufacturing of a electronics element and it cause the bad appearance. In view of the strict requirement of the appearance of the PCB, this uneven surface appearance becomes a problem.

Hence, the main spirit of the present invention is to provide a substrate structure and the fabrication method thereof, and then some disadvantages of well-known technology are overcome.

SUMMARY OF THE INVENTION

The primary object of the present invention is to provide a substrate structure and the fabrication method thereof. The present invention utilizes the laminate as the support of the package process and then removes the laminate after the following step so as to obtain a very smooth surface to apply to the electronics equipment with the strict requirement of the appearance.

Another object of the present invention is to provide a substrate structure used for the interlayer board of the capacity formulation and apply to the formulation of the multilayer board.

The further object of the present invention is to provide a substrate structure that can continuously stacking to form a stacking structure to form a multilayer structure circuit board.

The furthermore object of the present invention is to provide a substrate structure and the fabrication method thereof that can apply to many different types of the chip package structure to achieve the multipurpose.

In order to achieve previous objects, the present invention provides a fabrication method of a substrate structure. First, a laminate is provided, wherein there are arranged at least a conductive layer, or at least an adhesive layer and at least a conductive layer on the surface of the laminate from bottom to top. A patterned film is formed on the conductive layer and a film is formed on the laminate. Next, the patterned film is used as the mask to form a patterned through hole penetrating through the conductive layer, or the adhesive layer and the conductive layer. An insulator is formed on the conductive layer to fill up the pattern through hole. A copper is formed on the insulator, wherein there are a plurality of concave holes penetrating through the copper and a portion of the insulator so as to expose a portion of the conductive layer. A conduction layer formed in those concave holes and then the laminate is removed in suitable time according to the manufacturing requirement of the product.

The present invention utilizes the forgoing fabrication method to form a substrate structure Including at least a conductive layer with a patterned through hole; at least an insulator arranged on a portion of the conductive layer to fill up the patterned through hole; at least a copper arranged on the insulator to form a plurality of concave holes penetrating through a portion of the insulator to expose a portion of the conductive layer; and at least a conduction layer arranged around in the concave holes or fill up the concave holes.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
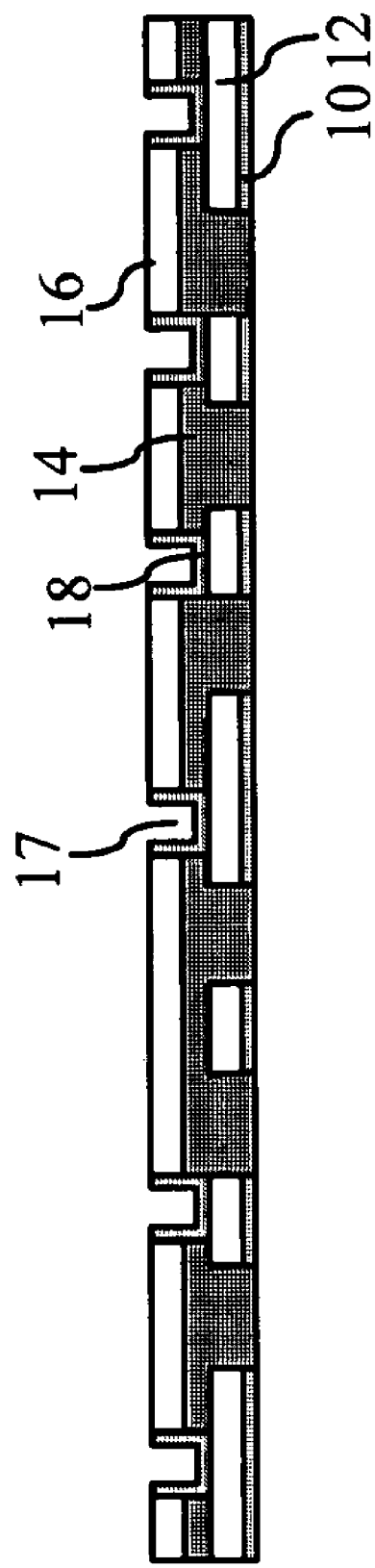
FIG. 1 is a schematic representation of the cross-section view of a substrate structure, in accordance with one embodiment of the present invention.

The present invention discloses a substrate structure and the fabrication method thereof. Referring to FIG. 1, the substrate structure includes a conductive layer 10, wherein the conductive layer 12 can be arranged on the adhesive layer 10 or not on the adhesive layer 12. There is a patterned through hole on the conductive layer 12 and there is arranged an insulator material 14 on the conductive layer 14 to fill up the patterned through hole. A copper 16 is arranged on the insulator material 14 to form a plurality of concave holes 17 penetrating through a portion of the insulator material 14 to expose a portion of the conductive layer 12. A conduction layer 18 is arranged around in those concave holes 17 or to fill up the concave holes 17. The conductive layer 18 is made of the copper or other conductive material. The substrate structure can be used as the interlayer of the normal circuit board for manufacturing the interlayer board of the capacity.

Figure 2:
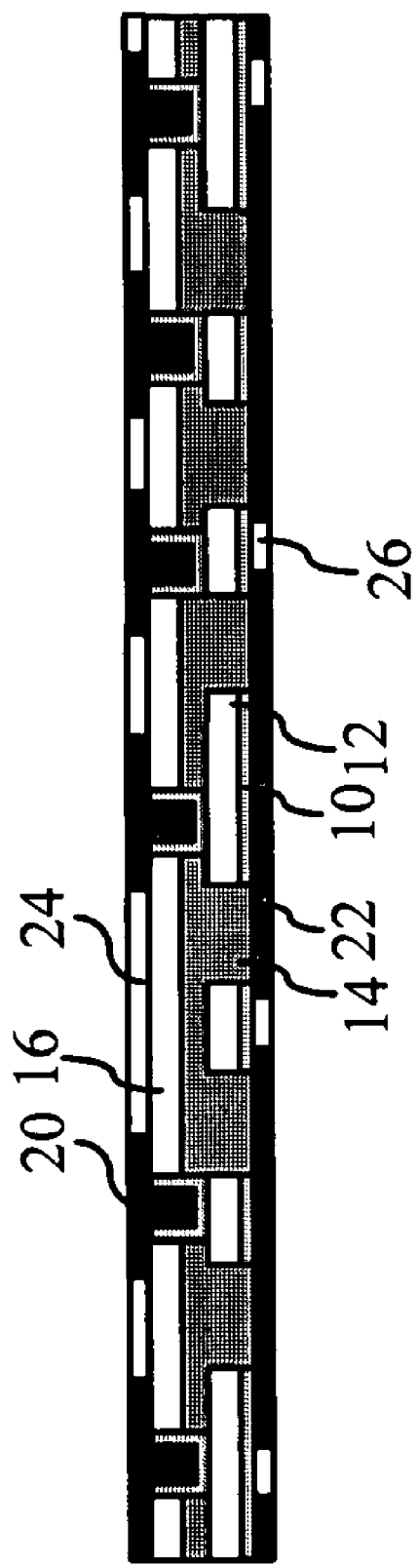
FIG. 2 is a schematic representation of the cross-section view of a substrate structure, in accordance with another embodiment of the present invention.

Referring to the FIG. 2 extending from FIG. 1, in those concave holes 17, there is selectively arranged a solder mask layer 20 to fill up those concave holes 17 to extend to a surface of a portion of the copper 16. Another solder mask layer 22 is arranged under the adhesive layer 10, or under the conductive layer 12 and the insulator material 14 to expose a portion of the adhesive layer 10. A metal layer 24 is respectively arranged on the copper 16 to expose the solder mask layer 20 and a metal layer 26 is arranged under the adhesive layer 10 to expose the solder mask layer 22. The present structure can obtain a quite smooth surface so as the wires track of the adhesive layer or the conductive layer 12 won't be exposed and can apply to the circuit board, such as the multimedia card (MMC), with the strict requirement of the appearance.

Figure 3:
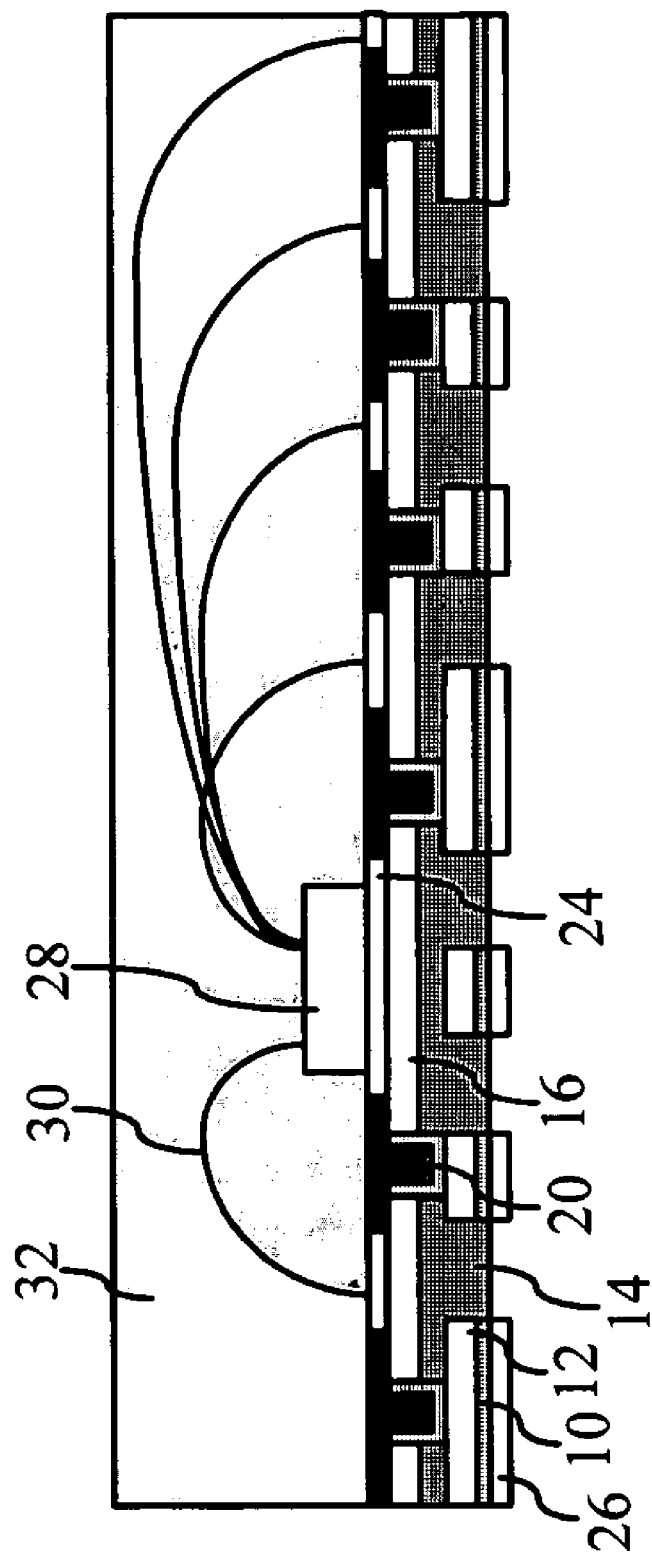
FIG. 3 is a schematic representation of the cross-section view of a chip package structure, in accordance with the substrate structure of the present invention.

FIG. 3, FIG. 4, FIG. 5, and FIG. 6 are various kinds of the chip package structures basically extending from FIG. 1. The chip substrate structure shown in FIG. 3 is selectively arranged a solder mask layer 20 in those concave holes 17 shown in FIG. 1, wherein the solder mask layer 20 is expending to the surface of the copper 16 to expose a portion of the surface of the copper 16. The metal layer 24 is arranged on the exposed copper 16 to expose the solder mask layer 20 so as a chip carrying area and a plurality of conductive joint areas are formed on the metal layer 24. Further, a metal layer 26 is arranged under the adhesive layer 10 and the conductive layer 14 to expose the insulator material 14. At least a chip 28 is arranged on the chip carrying area and the chip 28 utilizes a plurality of lead wires 30 to electrically connect with those conductive joint areas. An encapsulant 32 is covering the chip 28 and those lead wires 30. However, the metal layer 26 can also not be arranged under the adhesive layer 10 and the conductive layer 12 to form another chip package structure shown in FIG. 4.

Figure 5:
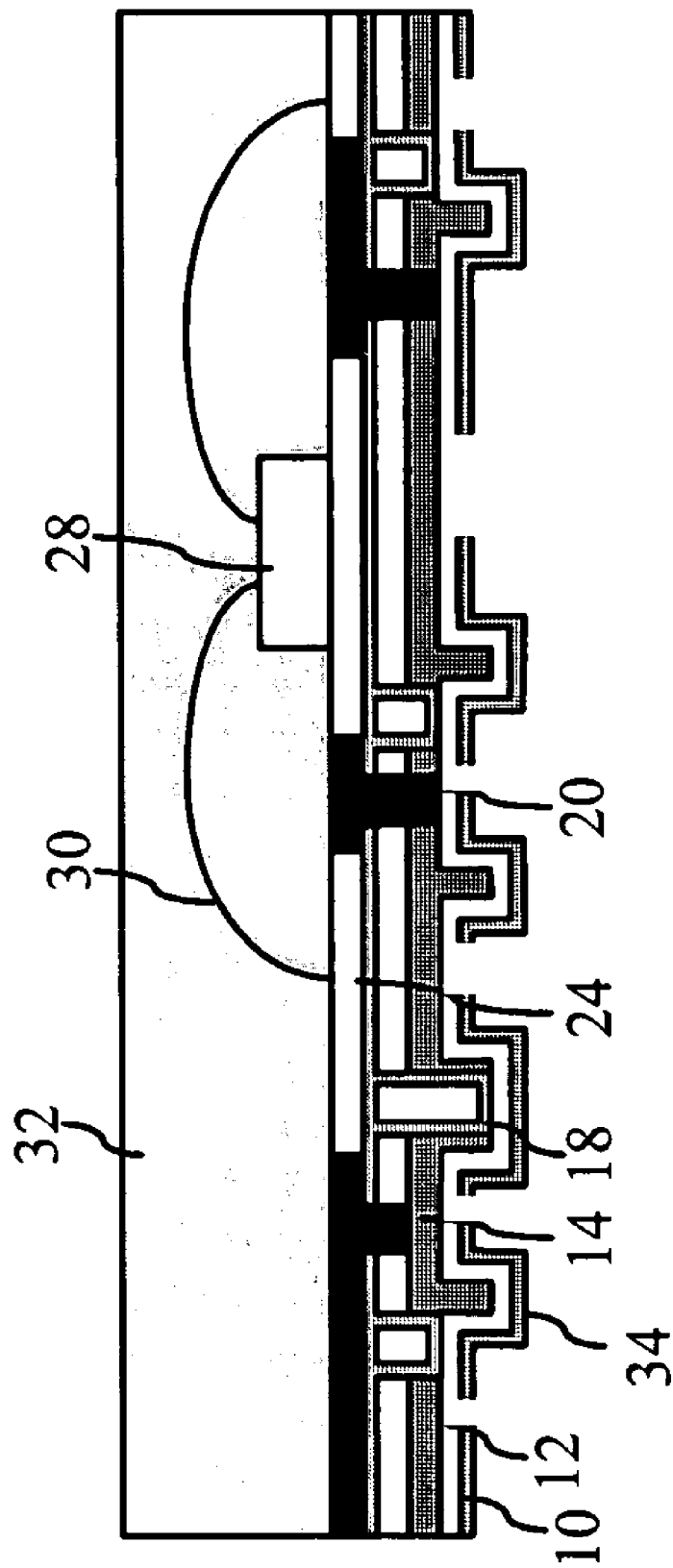
FIG. 5 is a schematic representation of the vertical view of the other chip package structure, in accordance with the substrate structure of the present invention.
Figure 6:
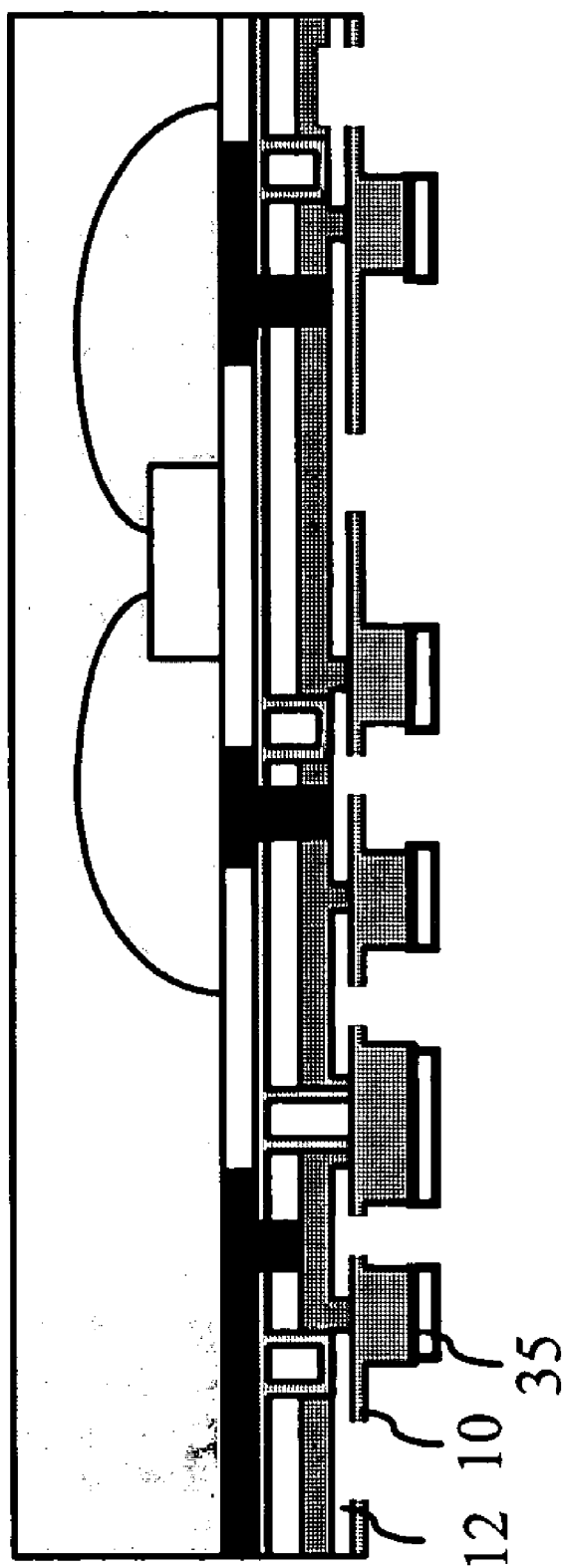
FIG. 6 is a schematic representation of the vertical view of the further chip package structure, in accordance with the substrate structure of the present invention.

Referring to FIG. 5, the adhesive layer 10 and the conductive layer 12 provide with a plurality of concave portions 34. The conduction layer 18 is arranged on the conductive layer 12 and expending to the copper 16 to expose a portion of the insulator material 14, wherein the insulator material 14 is filling up those concave portions 34. A solder mask layer 20 is arranged on the exposed insulator material 14 and expending to a portion of the surface of the copper 16. A metal layer 24 is arranged on a portion of the copper 16 and a portion of the conduction layer 18, wherein a chip carrying area and a plurality of conductive joint areas are formed on the metal layer 24. A chip 28 is arranged on the chip carrying area and utilizes lead wires 30 to electrically connect with those conductive joint areas. An encapsulant 32 is covering the chip 28 and the lead wires 30. The adhesive layer 10 can also arrange a down raised portion 35 shown in FIG. 6 to let the conductive layer 12 arrange on the adhesive layer 10.

Figure 7:
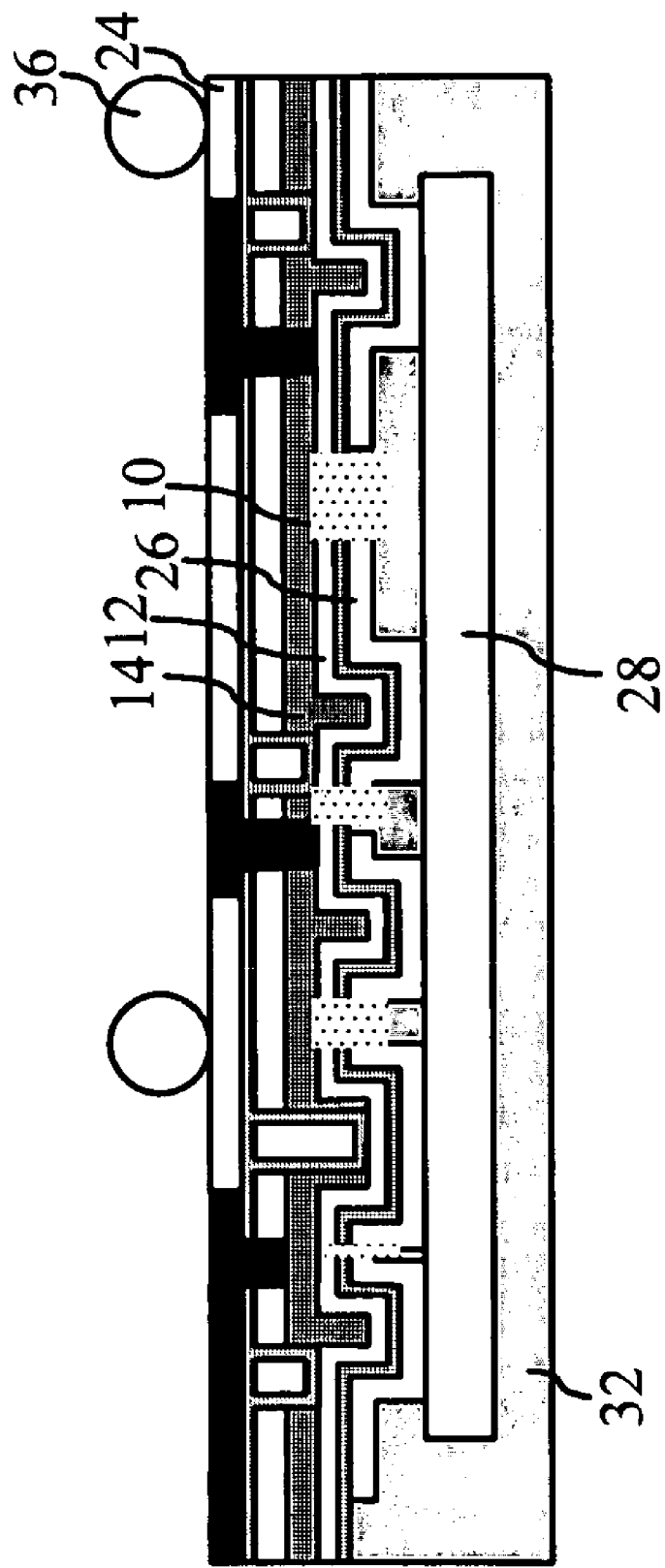
FIG. 7 is a schematic representation of the vertical view of the furthermore chip package structure, in accordance with the substrate structure of the present invention.

Referring to another chip package structure of FIG. 7 extending from FIG. 1 and comparing with FIG. 5, there is further arranged a metal layer 26 under the adhesive layer 10 and the conductive layer 12 to expose the insulator material 14. At least a chip 28 is arranged at the metal layer 26 under the adhesive layer 10 and the conductive layer 12. A plurality of solder balls 36 are arranged on the metal layer 24 on a portion of the copper 16 and an encapsulant 32 is covering the chip. After reversing the chip package structure of FIG. 7, it obtains a flip-chip package structure.

Wherein, in the above-mentioned structure of FIG. 1 to FIG. 7, the adhesive layer 10 is made of metal, conductive material, or polymer material.

According to each of the forgoing package structures, the present invention provides different fabrication methods. Referring to FIG. 8(a) to FIG. 8(h), first, a laminate 8 is provided, wherein the laminate 8 is made of metal, glass, ceramics, polymer material. At least an adhesive layer 10 and a plurality of conductive layer 12 are sequentially arranged on a surface of the laminate 8 from bottom to top. The laminate 8, the adhesive layer 10, and the conductive layer 12 can be the commercial good that formed before. The adhesive layer 10 is utilizing the adhering process, the lamination process, the printed process, the spray coating process, the spin coating process, the evaporation deposition process, the sputtering process, the electroless plating process, or the electroplate process to adhere on the laminate 8. Then, the conductive layer is utilizing the adhering process, the lamination process, the printed process, the spray coating process, the spin coating process, the evaporation deposition process, the sputtering process, the electroless plating process, or the electroplate process to arrange on the adhesive layer 10. The present invention can choose not to arrange the adhesive layer 10, but only arrange the conductive layer 12.

Figure 8A:
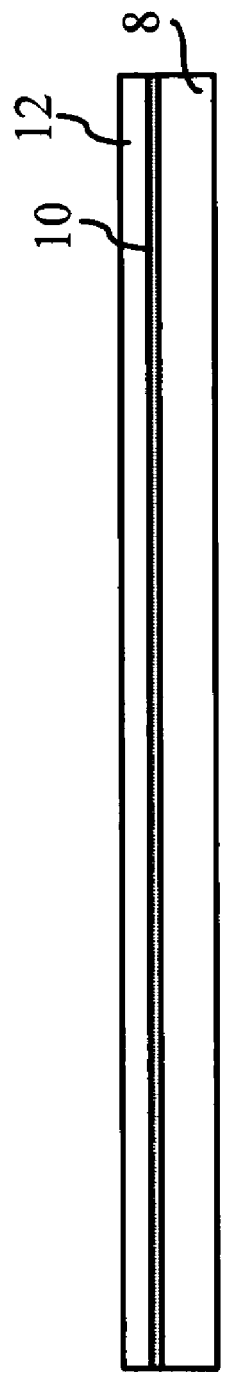
FIG. 8($a$) to FIG. 8($h$) are schematic representations of the cross-section view of the formulation steps of the substrate structure, in accordance with one embodiment of the present invention.
Figure 8B:
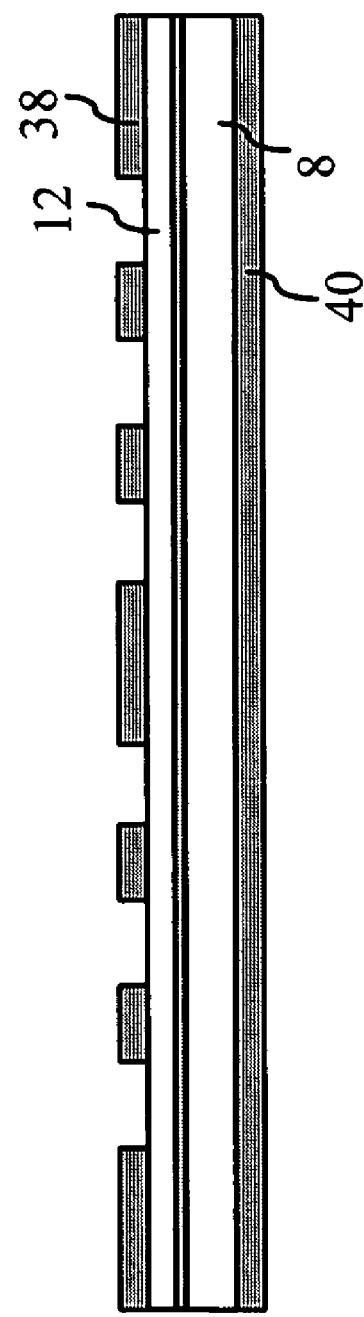
Figure 8C:
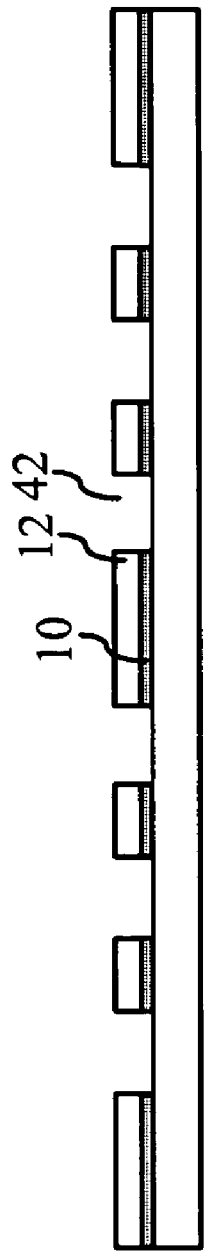
Figure 8D:
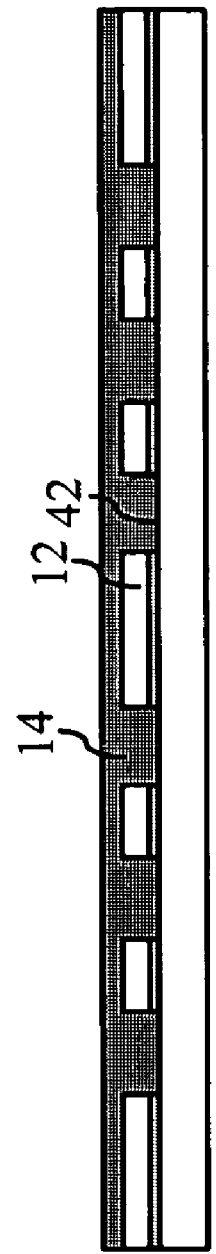
Figure 8E:
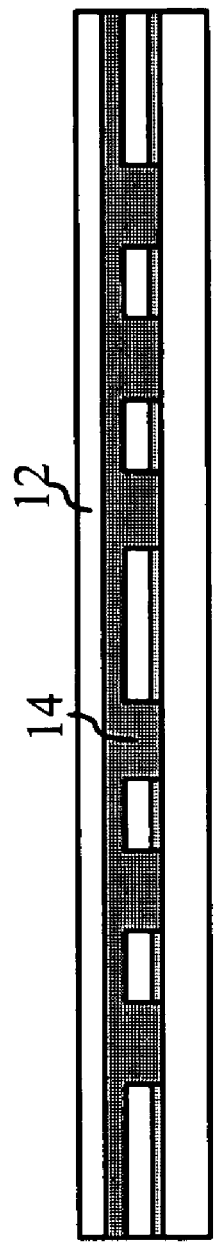
Figure 8F:
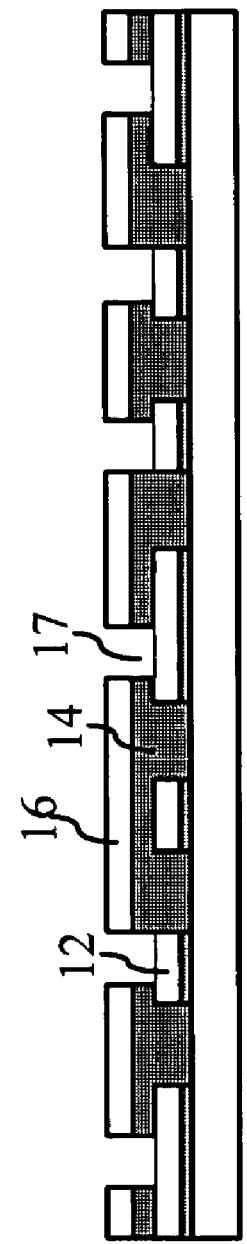
Figure 8G:
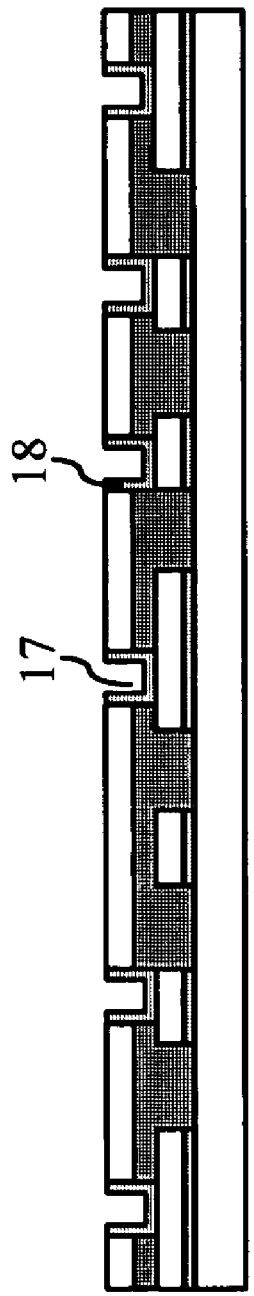
Figure 8H:
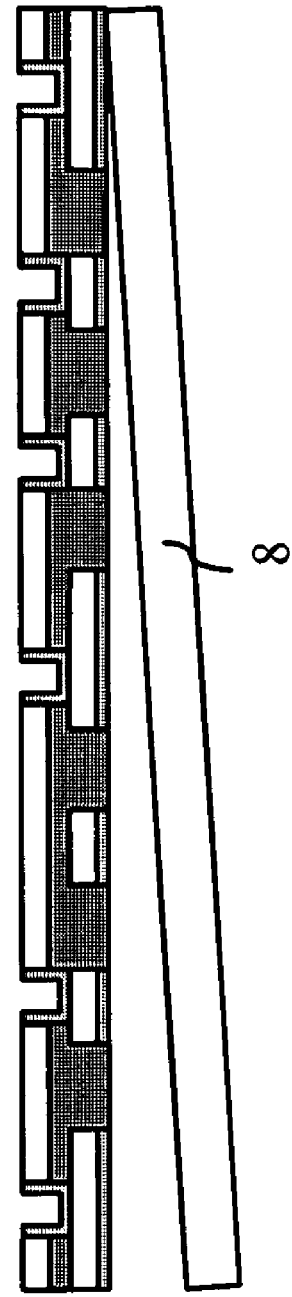

Following, as shown in FIG. 8(b), the present invention utilizes the photolithography process to respectively form a patterned film 38 and a film 40. Referring to FIG. 8(c), the patterned film 38 is used as a mask to utilize the laser marking process or the etching process to penetrate through the adhesive layer 10 and the conductive layer 12 to form a patterned through channel 42. Next, the patterned film 38 and the film 40 are removed. Referring to FIG. 8(d), on the conductive layer 12, it utilizes the lamination process, the spin coating process or the printed process to form at least one layer of the insulator material to fill up the patterned through channel 42. Then, referring to FIG. 8(e), it utilizes the adhering process, the lamination process, the electroless plating process, the printed process or the electroplate process to form at least on layer of the copper 16 on the insulator material 14. Next, as shown in FIG. 8(f), it utilizes the mechanic drilling process, the laser drilling process, or the plasma etching process to penetrate through the copper 16 and a portion of the insulator material 14 to form a plurality of concave holes 17 to expose a portion of the conductive layer 12. Following, referring to FIG. 8(g), it utilizes the evaporation deposition process, the sputtering process, or the electroplating process to form a plurality of metal conduction layer 18 around in those concave holes 17 or utilizes the printed process to fill the conduction layer 18 in those concave holes 17. Last, as shown in FIG. 8(h), after removing the laminate 8, the substrate basic structure shown in FIG. 1 is formed. This substrate structure can be the basic structure of the normal multilayer circuit board for forming all kinds of multilayer board by combining other circuit board processes.

Wherein, after the step of removing the laminate 8 shown in FIG. 8(h), it can further respectively form a solder mask layer 20 and a solder mask layer 22 on a portion of the copper and under a portion of the adhesive layer. The solder mask layer 20 and the solder mask layer 22 are respectively filling or un-filling up the concave holes 17 and expose a portion of the down surface of the adhesive layer 10. Following, a metal layer 24 and a metal layer 26 are respectively formed on a portion of the copper 16 and under a portion of the adhesive layer 10 to form the structure as shown in FIG. 2.

Figure 4:
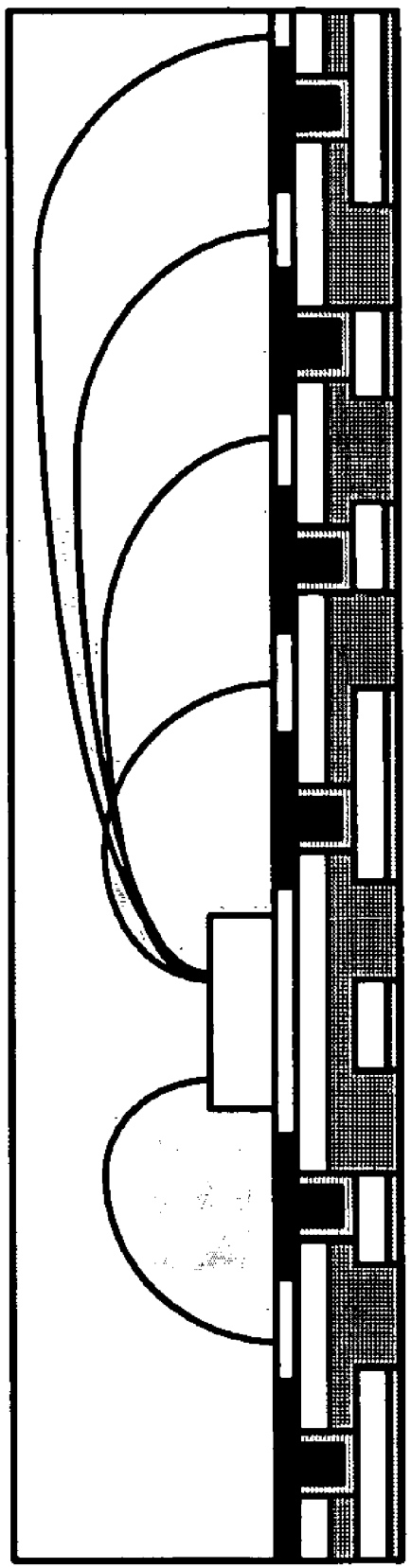
FIG. 4 is a schematic representation of the vertical view of another chip package structure, in accordance with the substrate structure of the present invention.

Besides, after or before the step of removing the laminate 8 shown in FIG. 8(h), it can form at least a photoresist or a solder mask layer 20 to fill up those concave holes 17 and extend to a portion of the surface of the copper 16. After removing the laminate 8, it further comprises a step for forming a metal layer 24 on the copper 16 to expose the photoresist or the solder mask layer 20 so as to form a chip carrying area and a plurality of conductive joint areas. A metal layer 26 is arranged under the adhesive layer 10 to expose a down surface of the insulator material 14. After forming the metal layer 24, at least a chip 28 is arranged on the chip carrying area, wherein the chip 28 is utilizing a plurality of lead wires 30 to electrically connect with the conductive joint areas and an encapsulant 32 is formed on the metal layer 24 on said copper to form the chip package structure as shown in FIG. 4.

Figure 9A:
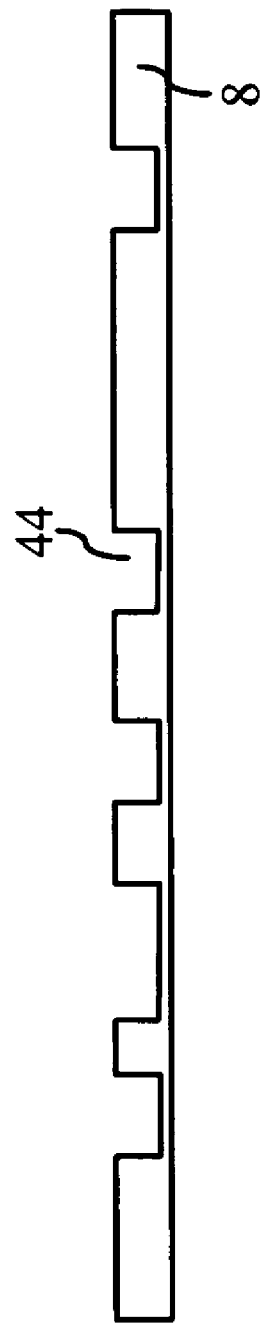
FIG. 9($a$) to FIG. 9($k$) are schematic representations of the cross-section view of another formulation steps of the substrate structure, in accordance with one embodiment of the present invention.
Figure 9B:
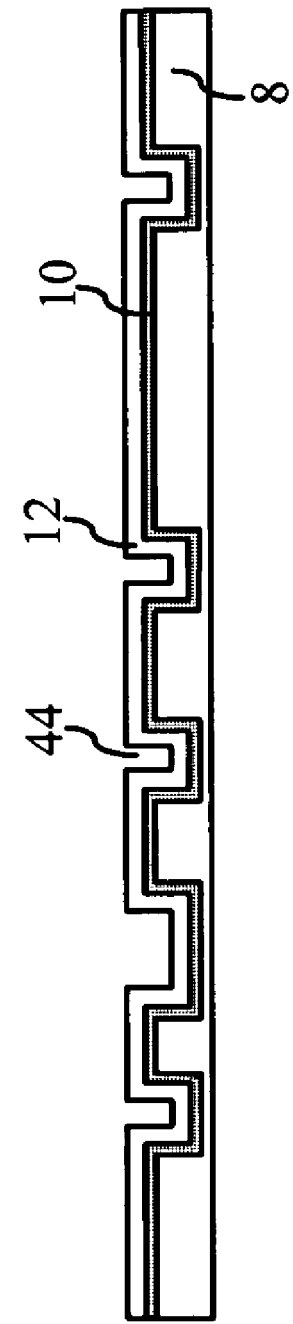
Figure 9C:
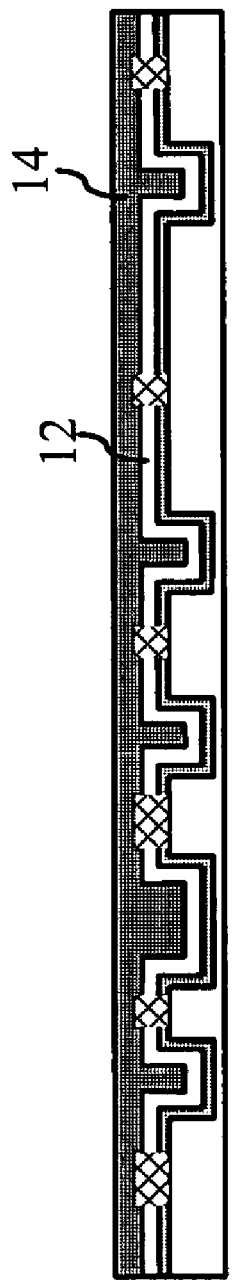
Figure 9D:
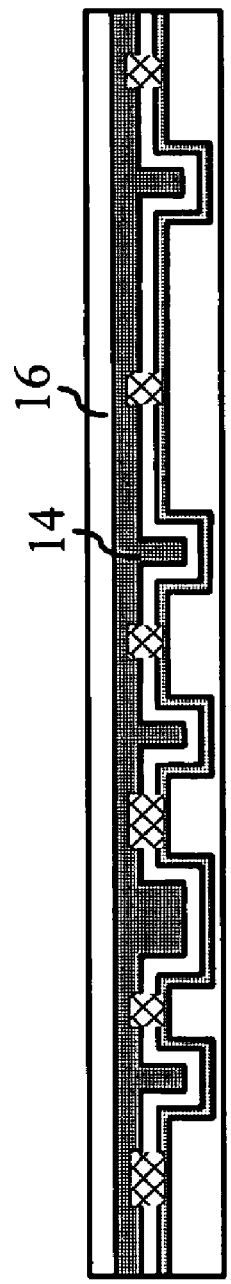
Figure 9E:
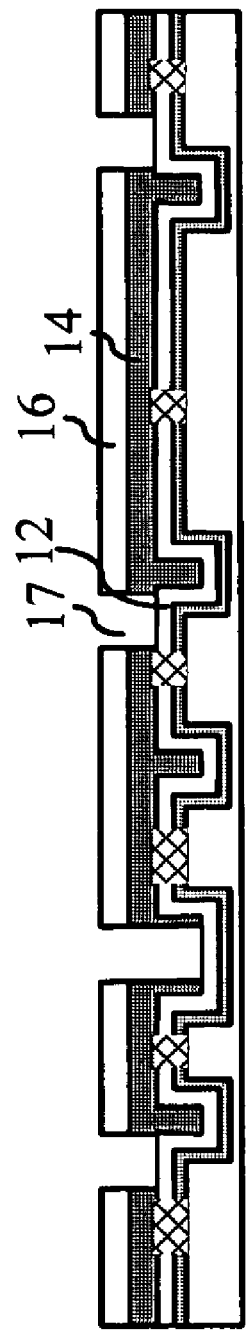
Figure 9F:
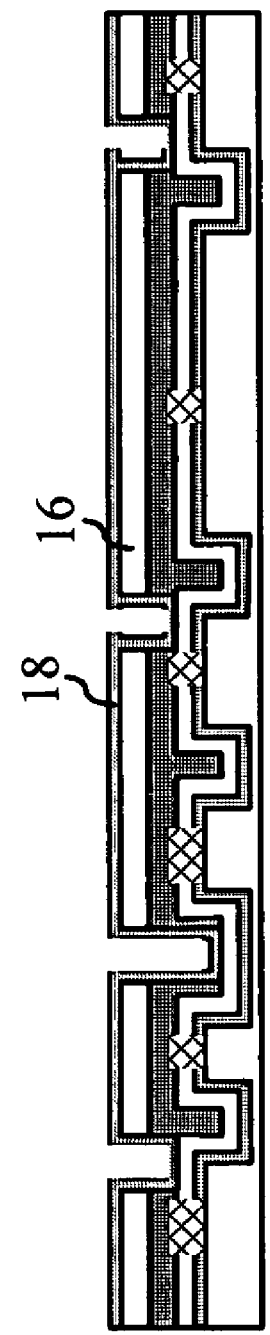
Figure 9G:
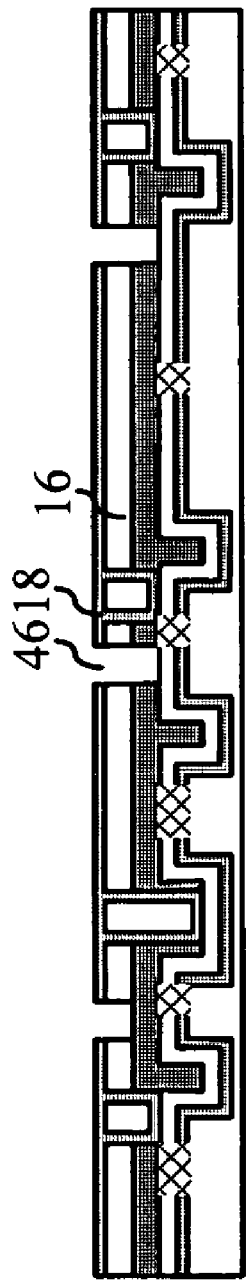
Figure 9H:
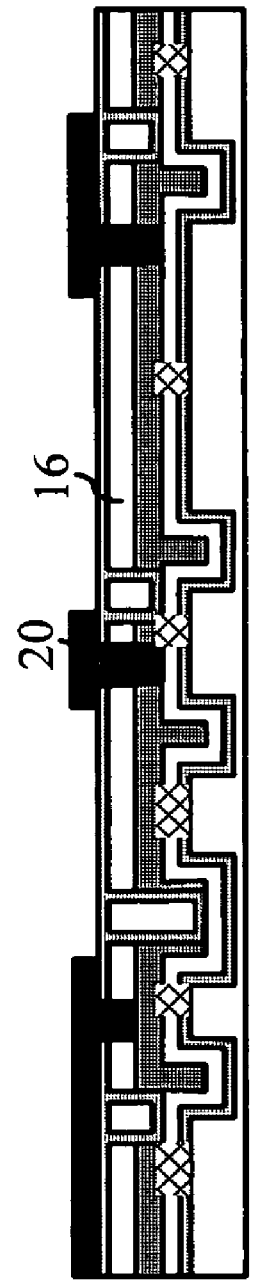
Figure 9I:
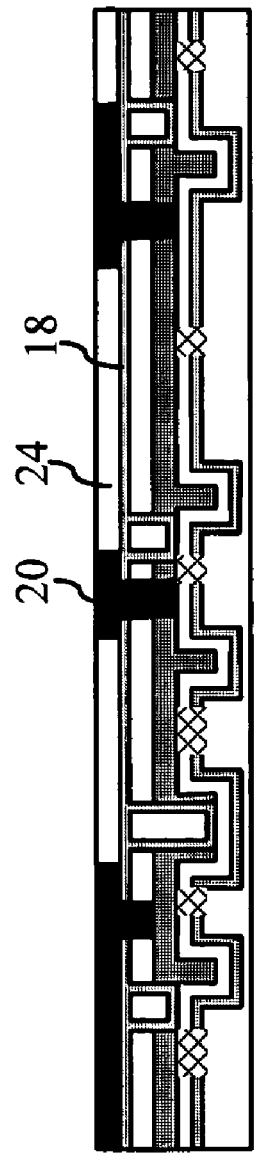
Figure 9J:
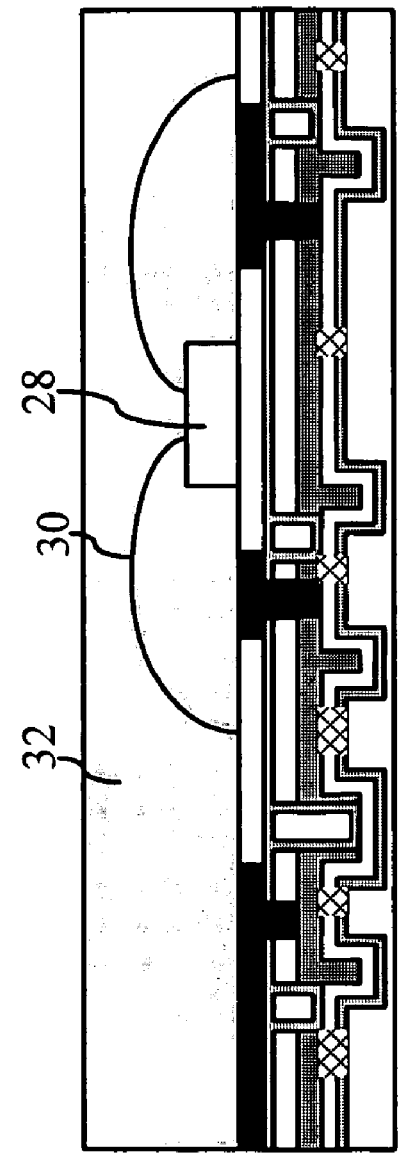
Figure 9K:
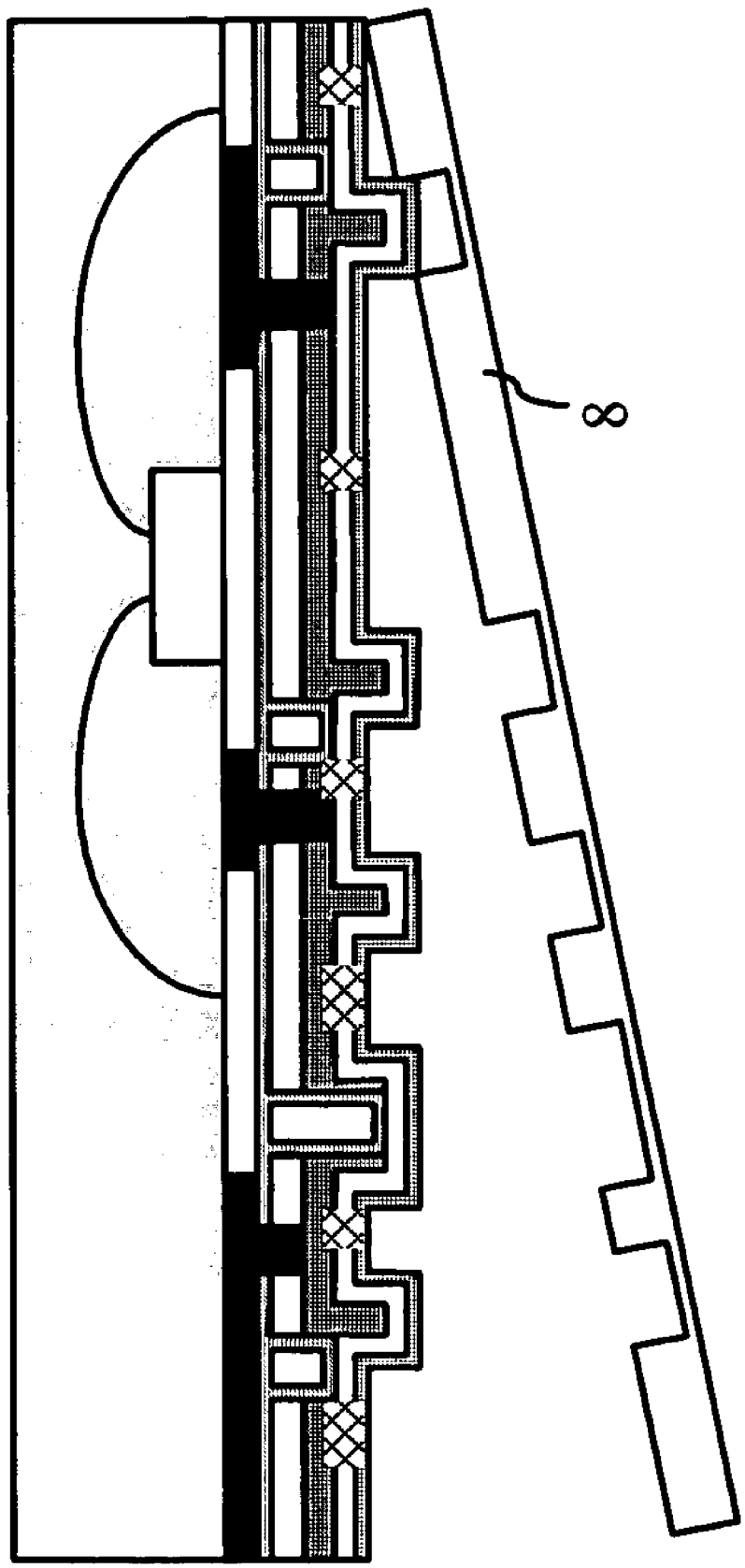

Referring to FIG. 9(a) to FIG. 9(k), first, a laminate 8 is provided, wherein the laminate 8 arranges a plurality of containing holes 44 thereon, such as shown in FIG. 9(a). Following, referring to FIG. 9(b), an adhesive layer 10 and a conductive layer 12 are formed on the laminate 8. Next, a photolithography process is performed to form the through hole and then an insulator mater 14 is formed on the conductive layer 12 to fill up the through hole and containing holes 44, such as shown in FIG. 9(c). Referring to FIG. 9(d), at least a layer of the copper 16 is formed on the insulator material 14. Following, such as shown in FIG. 9(e), there are arranged a plurality of concave holes 17 penetrating through the copper 16 and a portion of the insulator material 14 to expose a portion of the conductive layer 12. Then, a plurality of conduction layer 18 is formed around in those concave holes 17 and extending to the surface of the copper 16, such as shown in FIG. 9(f). Next, referring to FIG. 9(g), a patterned through channel 46 is formed to penetrate through a portion of the copper 16, or penetrate through a portion of the copper 16 and the conduction layer 18 thereon. Referring to FIG. 9(h), at least one layer of the solder mask layer 20 is formed in the patterned through channel 46 and extending to the surface of a portion of the copper 16. As shown in FIG. 9(i), the metal layer 24 is formed on a portion of the conduction layer 18 to expose the solder mask layer 20 to form a chip carrying area and a plurality of conductive joint areas. Next, referring to FIG. 9(j), at least a chip 28 is arranged on the chip carrying area, wherein the chip 28 is utilizing a plurality of lead wires to electrically connect with those conductive joint areas. Then, an encapsulant 32 is covering the chip 28 and those lead wires 30. Last, referring to FIG. 9(k), removing the laminate 8, the chip package structure shown in FIG. 5 is formed. However, the adhesive layer 10 can fill up the laminate 8 in first so as to form the chip package structure shown in FIG. 6.

Figure 10A:
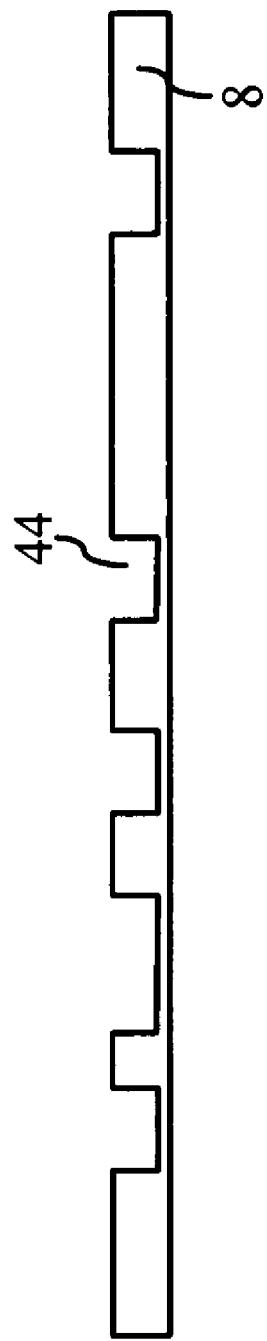
FIG. 10($a$) to FIG. 10($l$) are schematic representations of the cross-section view of the other formulation steps of the substrate structure, in accordance with one embodiment of the present invention.
Figure 10B:
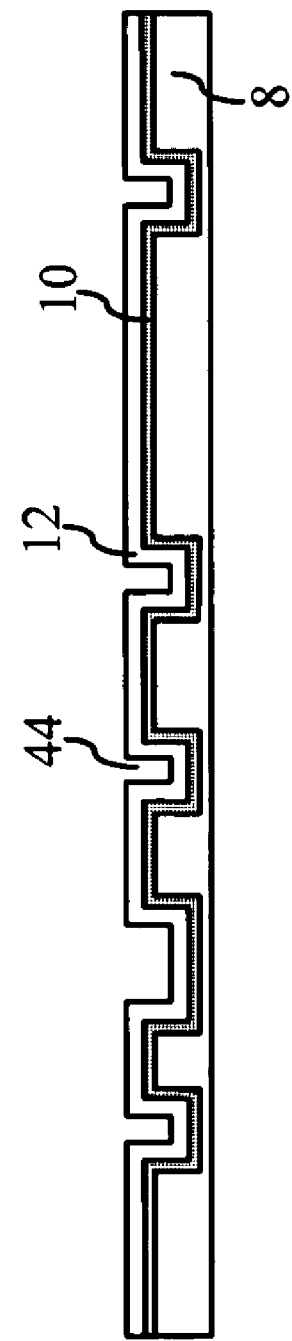
Figure 10C:
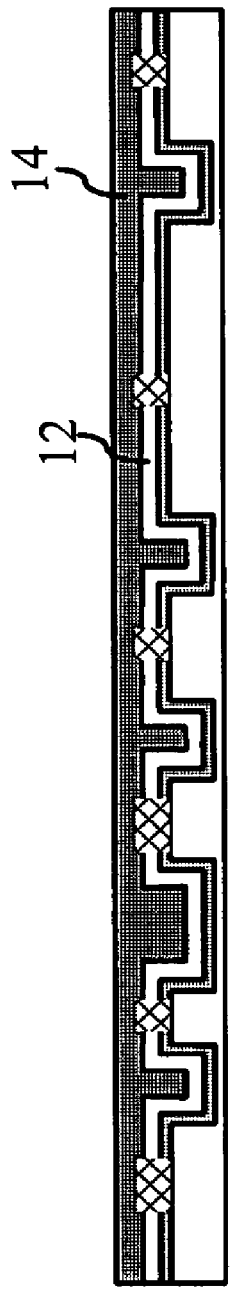
Figure 10D:
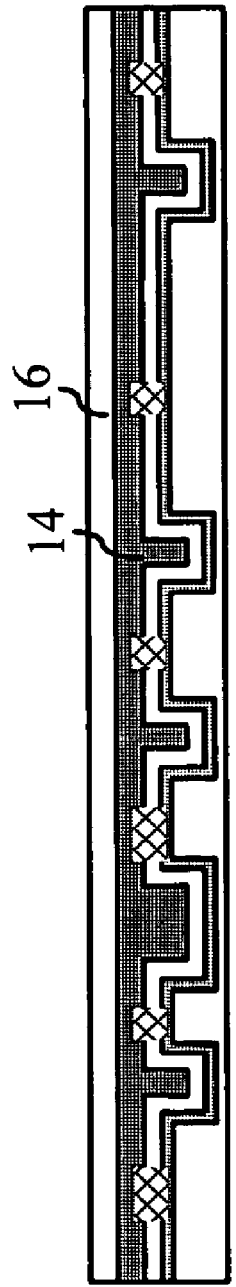
Figure 10E:
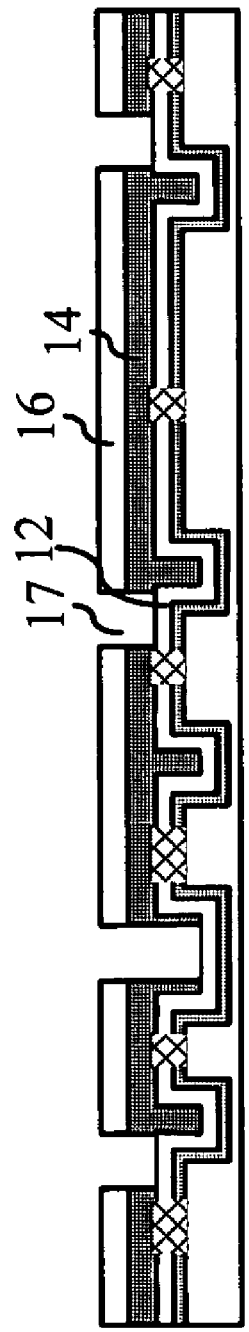
Figure 10F:
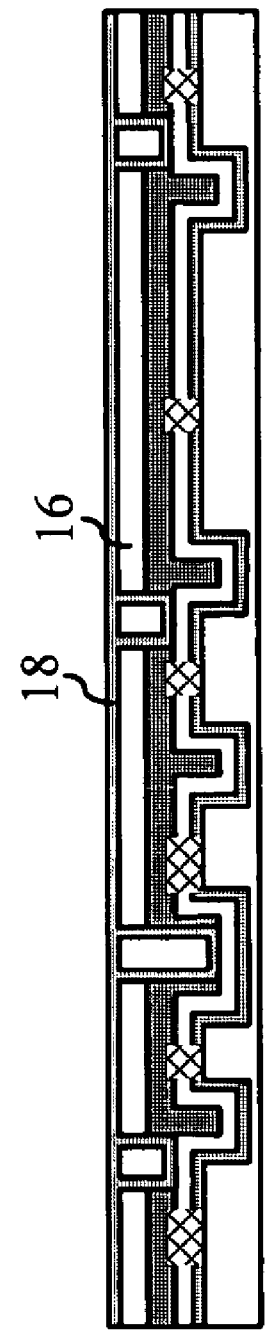
Figure 10G:
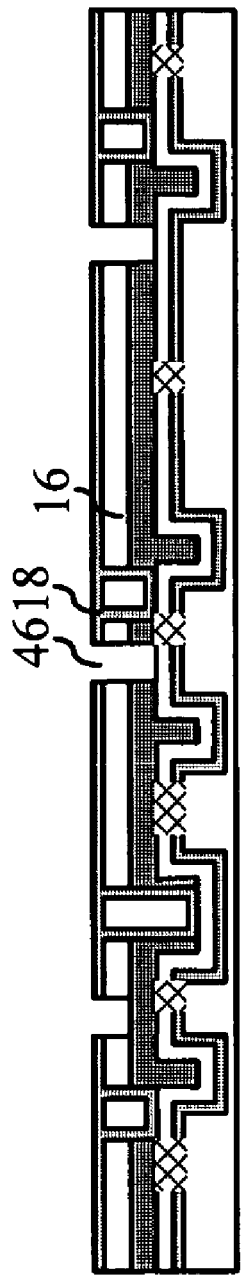
Figure 10H:
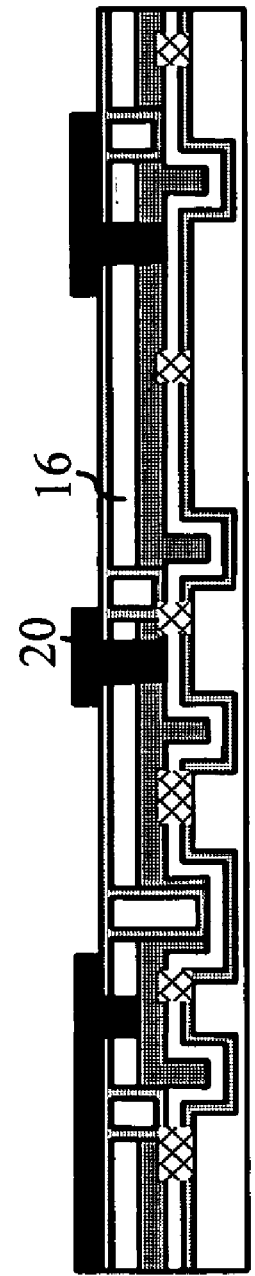
Figure 10I:
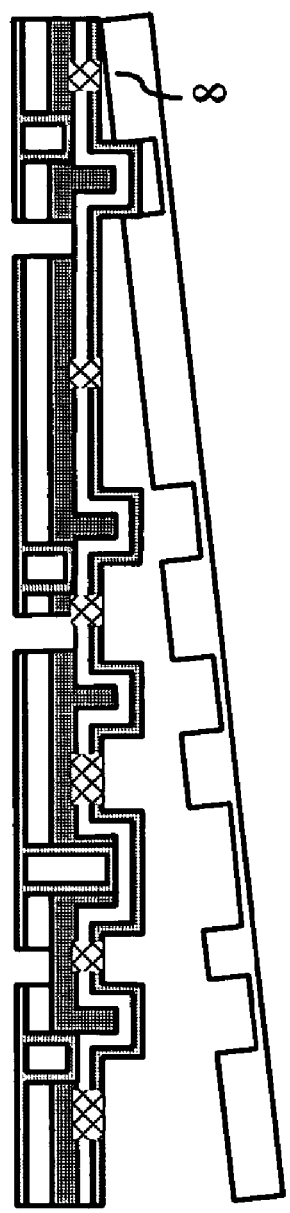
Figure 10J:
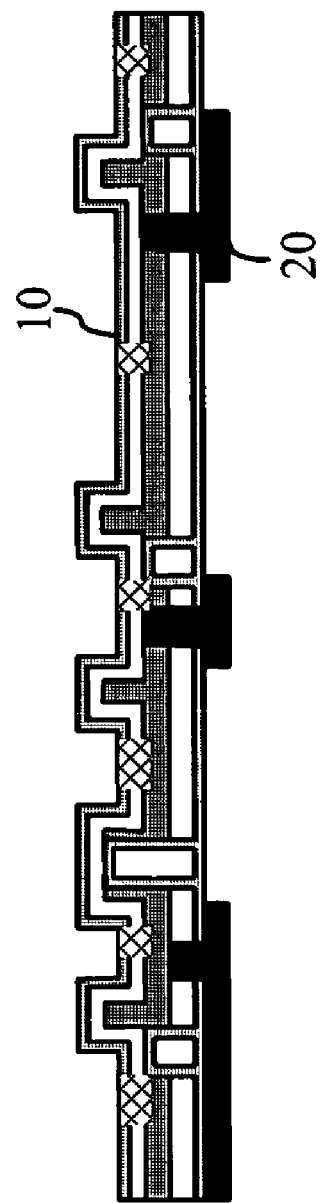
Figure 10K:
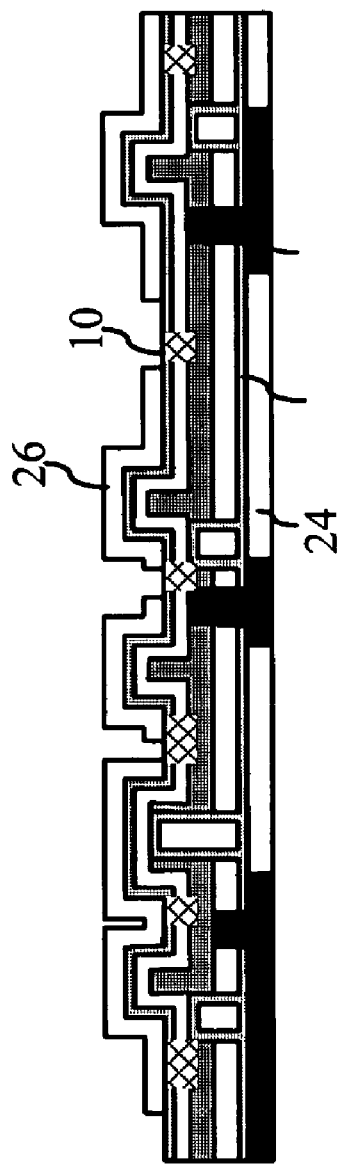
Figure 10L:
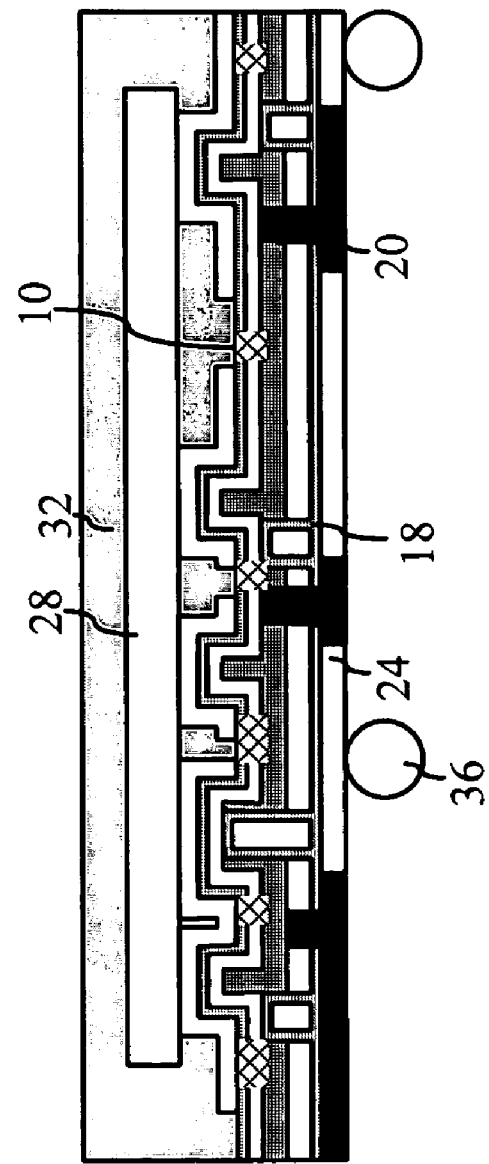

Referring to FIG. 10(a) to FIG. 10(l), the fabrication steps of FIG. 10(a) to FIG. 10(h) is the same as the steps described of FIG. 9(a) to FIG. 9(h), so there is no more redundant description herein. Then, after forming at least one layer of the solder mask layer 20 in the patterned through channel 46 and extending to the surface of a portion of the copper 16, and referring to FIG. 10(i), the laminate 8 is removed. Such as shown in FIG. 10(j), a reversal step is performed to make the solder mask layer 20 at the bottom side and the adhesive layer 10 at the top side. Following, referring to FIG. 10(k), the metal layer 24 and the metal layer 26 are respectively formed under the conduction layer 18 and on the adhesive layer 10 to respectively expose the solder mask layer 20 and expose a portion of the adhesive layer 10. Last, as shown in FIG. 10(l), at least a chip 28 and a plurality of solder balls 36 are arranged on the metal layer 24 on the adhesive layer 10, and under the metal layer 26 under the conduction layer 18. An encapsulant 32 is formed to cover the chip 28 and then the chip package structure of the flip-chip type as shown in FIG. 7 is formed.

The fabrication method of FIG. 9(a) to FIG. 9(k) and FIG. 10(a) to FIG. 10(l) are the same as the method described of FIG. 8(a) to FIG. 8(h), so there is no more redundant description herein. Further, all above-mentioned structure and method can be repeated stacking and operating to form the stacking structure to form the multilayer board.

To sum up the forgoing, the present invention provides a substrate structure and the fabrication method thereof. The present invention utilizes the laminate as the support of the package process and then removes the laminate after the following step so as to obtain a very smooth surface without the exposed lines of the conduction layer so as it can apply to the electronics equipment with the strict requirement of the appearance. The substrate structure can be used for the interlayer board of the capacity formulation and apply to the formulation of the multilayer structure circuit board by continuously stacking and forming a stacking structure. The present invention can apply to many different types of the chip package structure so as to achieve the multipurpose effect.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A fabrication method of a package substrate structure comprising the following steps:
   providing a laminate comprising at least a adhesive layer and at least a conductive layer sequentially arranged on a surface of said laminate from bottom to top;
   respectively forming a patterned film on said conductive layer and a film under said laminate;
   using said patterned film as a mask to penetrate through said adhesive layer and said conductive layer to form a patterned trench;
   removing said patterned film and said film;
   filling at least a insulator on said conductive layer to fill up said patterned trench;
   forming at least a copper on said insulator;
   forming a plurality of concave holes penetrating through a portion of said copper and a portion of said insulator to expose a portion of said conductive layer;
   forming a plurality of conduction layers around in said concave holes; and
   removing said laminate.

2. The fabrication method of a package substrate structure according to claim 1, wherein said laminate is made of metal, glass, ceramic material, and polymer material.

3. The fabrication method of a package substrate structure according to claim 1, wherein said adhesive layer is made of metal, conductive material, and polymer material.

4. The fabrication method of a package substrate structure according to claim 1, wherein there are a plurality of containing holes arranged on said laminate, and wherein a portion of said adhesive layer, a portion of said conductive layer, and a portion of said insulator are formed around in said containing holes and extending to a surface of said laminate.

5. The fabrication method of a package substrate structure according to claim 4, wherein said adhesive layer is filling up said containing holes.

6. The fabrication method of a package substrate structure according to claim 1, wherein the step of forming said adhesive layer on said laminate is utilizing the adhering process, the lamination process, the printed process, the spray coating process, the spin coating process, the evaporation deposition process, the sputtering process, the electroless plating process, or the electroplate process.

7. The fabrication method of a package substrate structure according to claim 1, wherein the step of forming said conductive layer on said adhesive layer is utilizing the adhering process, the lamination process, the printed process, the spray coating process, the spin coating process, the evaporation deposition process, the sputtering process, the electroless plating process, or the electroplate process.

8. The fabrication method of a package substrate structure according to claim 4, wherein the step of forming said patterned film and said film is utilizing the photolithography process.

9. The fabrication method of a package substrate structure according to claim 1, wherein the step of forming said patterned hole is utilizing the laser marking process or the etching process.

10. The fabrication method of a package substrate structure according to claim 1, wherein the step of forming said insulator is utilizing the lamination process, the spin coating process or the printed process.

11. The fabrication method of a package substrate structure according to claim 1, wherein said conduction layer is made of the copper material.

12. The fabrication method of a package substrate structure according to claim 1, wherein the step of forming said conduction layer is utilizing the lamination process, the electroless plating process, the printed process or the electroplate process.

13. The fabrication method of a package substrate structure according to claim 1, wherein the step of forming said concave holes is utilizing the mechanic drilling process, the laser drilling process, or the plasma etching process.

14. The fabrication method of a package substrate structure according to claim 1, before or after removing said laminate, further comprising a step of forming at least a photoresistor a solder mask layer to fill up said concave holes and extend to a portion of said surface of said copper.

15. The fabrication method of a package substrate structure according to claim 14, after removing said laminate, further comprising a step for forming a metal layer on said copper to expose said photoresistor said solder mask so as to form a chip carrying area and a plurality of conductive joint areas.

16. The fabrication method of a package substrate structure according to claim 15, wherein said metal layer can further be arranged under said adhesive layer to expose a down surface of said insulator.

17. The fabrication method of a package substrate structure according to claim 15, after the step of forming said metal layer, further comprising a step of arranging at least a chip on said chip carrying area, wherein said chip is utilizing a plurality of lead wires to electrically connect with said conductive joint areas and an encapsulant is formed on said metal layer on said copper.

18. The fabrication method of a package substrate structure according to claim 16, after the step of forming said metal layer, further comprising a step of arranging at least a chip on said chip carrying area, wherein said chip is utilizing a plurality of lead wires to electrically connect with said conductive joint areas and an encapsulant is formed on said metal layer on said copper.

19. The fabrication method of a package substrate structure according to claim 1, after removing said laminate, further comprising a step of forming at least a solder mask layer on a portion of said copper and under a portion of said adhesive layer to respectively fill up said concave holes and expose a portion of a down surface of said adhesive layer.

20. The fabrication method of a package substrate structure according to claim 19, after the step of forming said solder mask layer, further comprising a step of forming at least a metal layer on a portion of said copper and under a portion of said adhesive layer.

21. The fabrication method of a package substrate structure according to claim 4, wherein said conduction layer is arranged around in said containing holes and extending to said surface of said copper.

22. The fabrication method of a package substrate structure according to claim 5, wherein said conduction layer is arranged around in said containing holes and extending to said surface of said copper.

23. The fabrication method of a package substrate structure according to claim 21, after the step of forming said conduction layer, further comprising a step of forming a patterned through channel penetrating through a portion of said cooper or penetrating through a portion of said copper and said conduction layer on said copper.

24. The fabrication method of a package substrate structure according to claim 22, after the step of forming said conduction layer, further comprising a step of forming a patterned through channel penetrating through a portion of said cooper or penetrating through a portion of said copper and said conduction layer on said copper.

25. The fabrication method of a package substrate structure according to claim 23, wherein a stacking structure is formed by sequentially arranging said insulator, said copper, and said conduction layer in said patterned through channel from bottom to top.

26. The fabrication method of a package substrate structure according to claim 23, after the step of forming said patterned through channel, further comprising a step of forming a solder mask layer in said patterned through channel and expending to said surface of said copper.

27. The fabrication method of a package substrate structure according to claim 26, after or before removing said laminate, further comprising a step for forming a metal layer on said conduction layer to expose said solder mask layer so as to form a chip carrying area and a plurality of conductive joint areas.

28. The fabrication method of a package substrate structure according to claim 27, after the step of forming said metal layer, further comprising a step of arranging at least a chip on said chip carrying area, wherein said chip is utilizing a plurality of lead wires to electrically connect with said conductive joint areas and is utilizing an encapsulant to cover said chip and said lead wires.

29. The fabrication method of a package substrate structure according to claim 26, after removing said laminate, further comprising a reversal step to make said solder mask layer at the bottom side and said adhesive layer at the top side.

30. The fabrication method of a package substrate structure according to claim 29, after the reversal step, further comprising a step of respectively forming at least a metal layer on said adhesive layer and under said conduction layer to respectively expose a portion of said insulator and expose said adhesive layer.

31. The fabrication method of a package substrate structure according to claim 30, after the step of forming said metal layer, further comprising a step of arranging a chip and a plurality of solder balls on said metal layer on said adhesive layer and under said metal layer under said conduction layer, and to form an encapsulant to cover said chip.

* * * * *